US011500576B2

(12) United States Patent
Chen

(10) Patent No.: US 11,500,576 B2
(45) Date of Patent: *Nov. 15, 2022

(54) APPARATUS AND ARCHITECTURE OF NON-VOLATILE MEMORY MODULE IN PARALLEL CONFIGURATION

(71) Applicant: Entrantech Inc., Gilroy, CA (US)

(72) Inventor: Kong-Chen Chen, Gilroy, CA (US)

(73) Assignee: Entrantech Inc., Gilroy, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/094,787

(22) Filed: Nov. 10, 2020

(65) Prior Publication Data

US 2021/0132856 A1 May 6, 2021

Related U.S. Application Data

(63) Continuation-in-part of application No. 16/114,153, filed on Aug. 27, 2018, now Pat. No. 10,831,963.
(Continued)

(51) Int. Cl.
*G06F 3/06* (2006.01)
*G06F 30/39* (2020.01)
(Continued)

(52) U.S. Cl.
CPC ............ *G06F 3/0655* (2013.01); *G06F 3/061* (2013.01); *G06F 3/0679* (2013.01);
(Continued)

(58) Field of Classification Search
CPC .... G06F 30/39; G06F 9/30029; G06F 9/5061; G06F 12/0246; G06F 12/147;
(Continued)

(56) References Cited

U.S. PATENT DOCUMENTS 9,785,365 B1 10/2017 Shallal et al.
10,147,712 B1 12/2018 Lendvay
(Continued)

FOREIGN PATENT DOCUMENTS

WO WO-2017023508 A1 * 2/2017 ......... G06F 13/1678

OTHER PUBLICATIONS

U.S. Appl. No. 16/114,153, Non-Final Office Action dated Jan. 27, 2020.
(Continued)

*Primary Examiner* — Phallaka Kik
(74) *Attorney, Agent, or Firm* — Weaver Austin Villeneuve & Sampson LLP

(57) ABSTRACT

A non-volatile memory module in parallel architecture is described. It includes memory function and data storage function in a single module. It enables host system to use memory bus to access storage devices and to use the same memory command protocol for storage device access. The parallel architecture enables contents in memory devices and storage devices to be exchanged freely on module under the control of host memory controller to boost performance of computer and to retain data even if power to computer is shut off. The configuration of non-volatile memory module can be partitioned or expanded into multiple independent channels on module seamlessly with or without ECC supports.

24 Claims, 4 Drawing Sheets

Design Architecture for a 80-bit Parallel NVDIMM

Related U.S. Application Data

(60) Provisional application No. 62/550,618, filed on Aug. 26, 2017.

(51) Int. Cl.

| | | |
|---|---|---|
| *G06F 9/30* | (2018.01) | |
| *G06F 9/50* | (2006.01) | |
| *G06F 12/02* | (2006.01) | |
| *G06F 12/14* | (2006.01) | |
| *G06F 13/28* | (2006.01) | |
| *G06F 13/36* | (2006.01) | |
| *H05K 7/10* | (2006.01) | |

(52) U.S. Cl.
CPC ........ *G06F 9/30029* (2013.01); *G06F 9/5061* (2013.01); *G06F 12/0246* (2013.01); *G06F 13/28* (2013.01); *G06F 13/36* (2013.01); *G06F 30/39* (2020.01); *H05K 7/10* (2013.01)

(58) Field of Classification Search
CPC .......... G06F 13/00; G06F 13/28; G06F 13/36; G06F 13/23; G06F 3/0655; G06F 3/061; G06F 3/0679; H05K 7/10
USPC ....... 716/110, 119, 122, 123, 124, 125, 132, 716/131; 711/2, 5, 101, 117, 120, 130; 710/22, 301, 308, 313, 315
See application file for complete search history.

(56) References Cited

U.S. PATENT DOCUMENTS

| | | |
|---|---|---|
| 10,635,586 B2 | 4/2020 | Shallal |
| 10,679,722 B2 | 6/2020 | Helmick et al. |
| 10,747,694 B2 * | 8/2020 | Lalam ................. G06F 13/1694 |
| 10,831,963 B1 * | 11/2020 | Chen ....................... G06F 30/39 |
| 10,930,632 B2 * | 2/2021 | Lendvay ............. G06F 13/4063 |
| 2005/0139977 A1 | 6/2005 | Nishio et al. |
| 2008/0215802 A1 * | 9/2008 | Chow ................ G11C 13/0004 |
| | | 711/E12.008 |
| 2008/0228996 A1 | 9/2008 | Tan et al. |
| 2009/0083476 A1 | 3/2009 | Pua et al. |
| 2010/0205348 A1 | 8/2010 | Moshayedl et al. |
| 2012/0271990 A1 | 10/2012 | Chen et al. |
| 2015/0261446 A1 | 9/2015 | Lee |
| 2015/0310898 A1 | 10/2015 | Takefman et al. |
| 2016/0342487 A1 | 11/2016 | Ware et al. |
| 2016/0350002 A1 | 12/2016 | Vergis et al. |
| 2017/0109058 A1 | 4/2017 | Shallal et al. |
| 2017/0206036 A1 | 7/2017 | Pax et al. |
| 2017/0351626 A1 | 12/2017 | Lalam |
| 2018/0005670 A1 | 1/2018 | Lee et al. |
| 2018/0059944 A1 | 3/2018 | Helmick et al. |
| 2018/0059976 A1 | 3/2018 | Helmick et al. |
| 2018/0060257 A1 | 3/2018 | Nygren et al. |
| 2018/0197584 A1 | 7/2018 | Lee et al. |
| 2018/0246643 A1 | 8/2018 | Uenne et al. |
| 2018/0246647 A1 | 8/2018 | Sankaranarayanan et al. |
| 2018/0285013 A1 * | 10/2018 | Rajan ................... G06F 3/0656 |
| 2018/0329850 A1 | 11/2018 | Lim et al. |
| 2019/0196725 A1 | 6/2019 | Lendvay |
| 2019/0286560 A1 | 9/2019 | Shallal |
| 2019/0347036 A1 | 11/2019 | Pax et al. |
| 2020/0034046 A1 | 1/2020 | Shallal et al. |
| 2020/0356475 A1 * | 11/2020 | Shallal ................ G06F 12/0802 |

OTHER PUBLICATIONS

U.S. Appl. No. 16/114,153, Notice of Allowance dated Jul. 14, 2020.

* cited by examiner

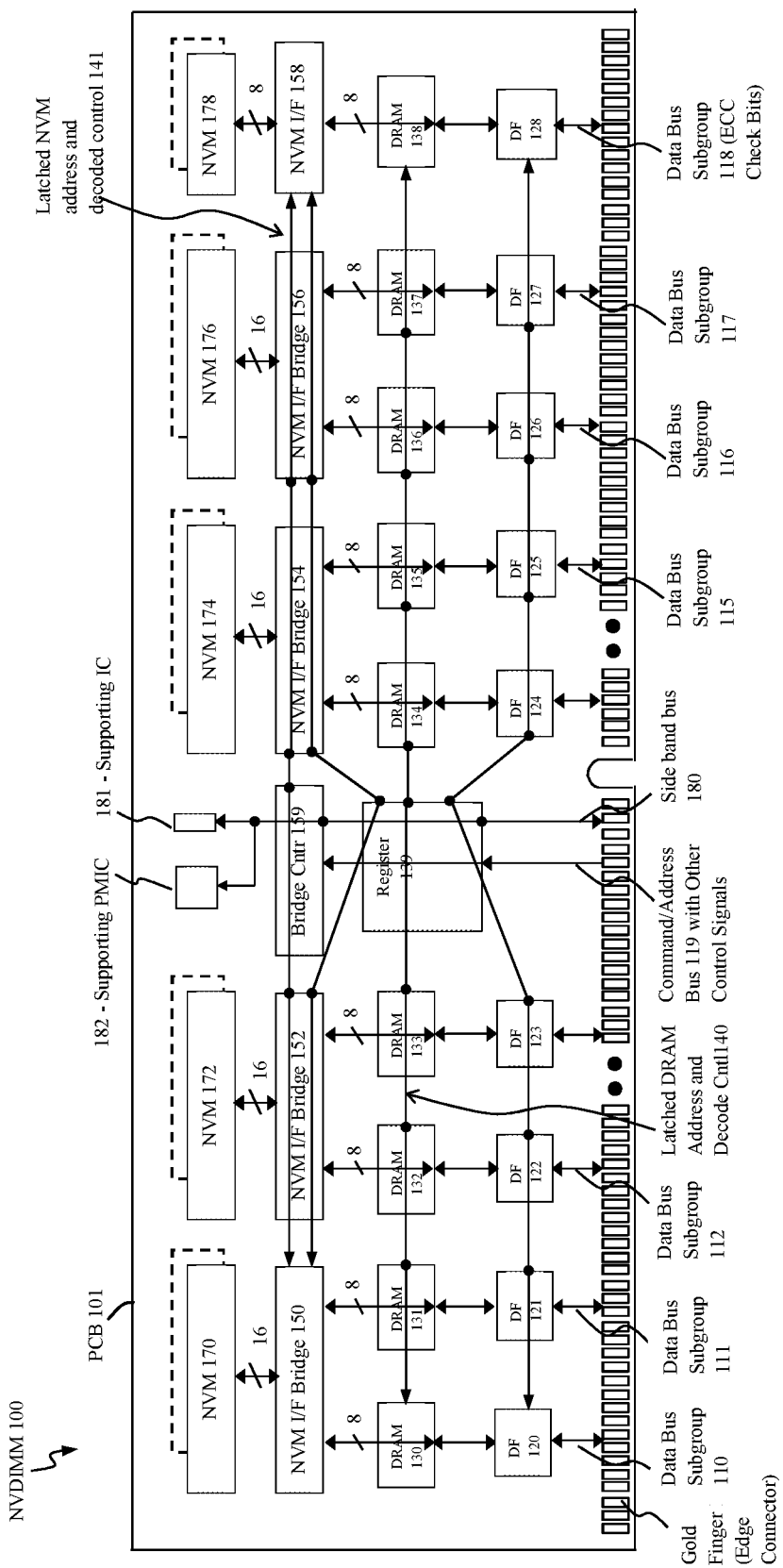
FIG 1 Parallel NVDIMM Design Architecture in 64-bit Data Bus and 8-bit ECC with 16-bit Interface Bridege Chips

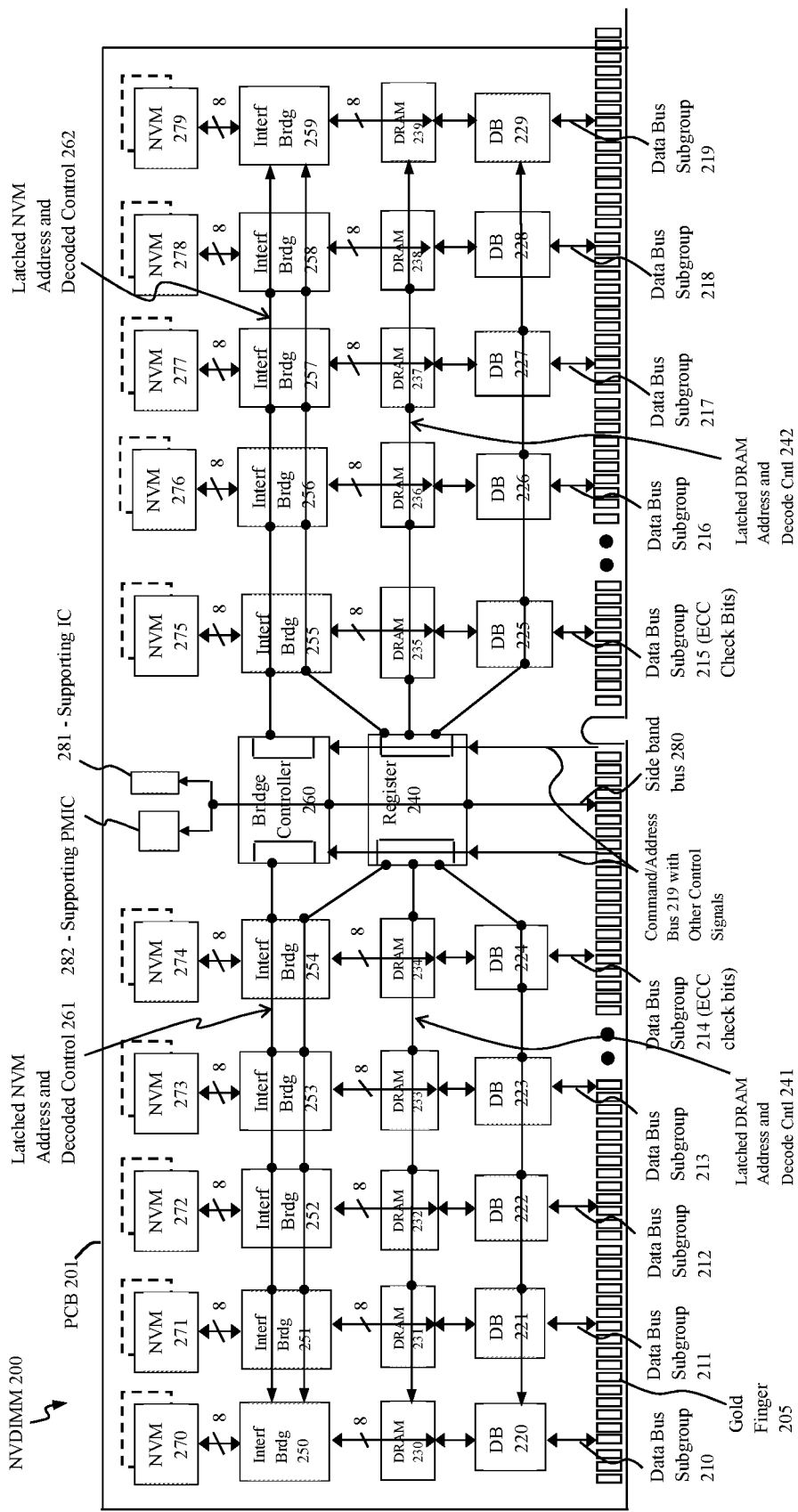
FIG. 2 Design Architecture for a 80-bit Parallel NVDIMM

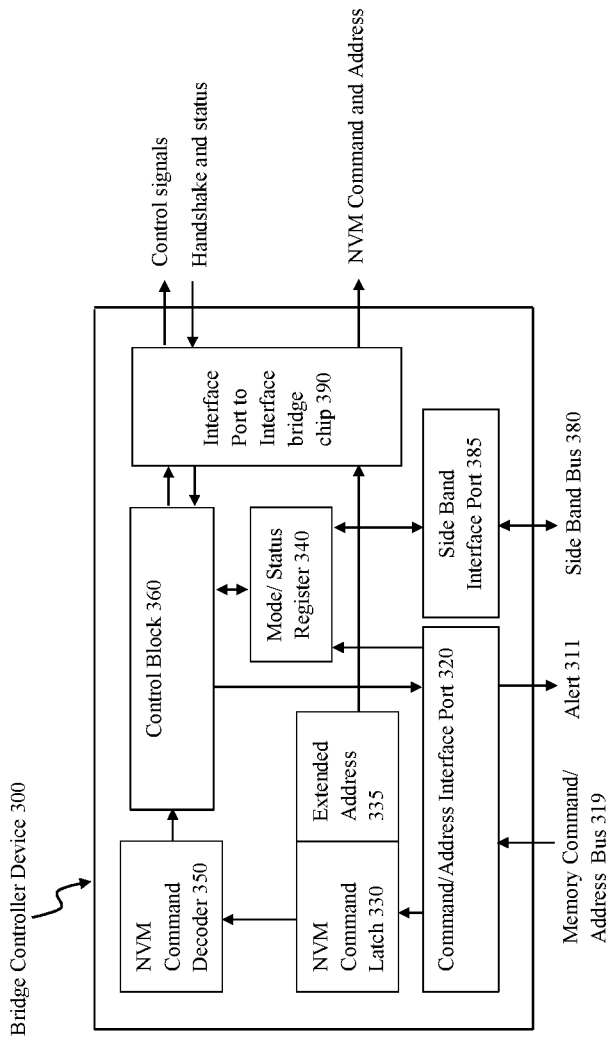
FIG. 3 Example of Functional Block Diagram of Bridge Controller Device

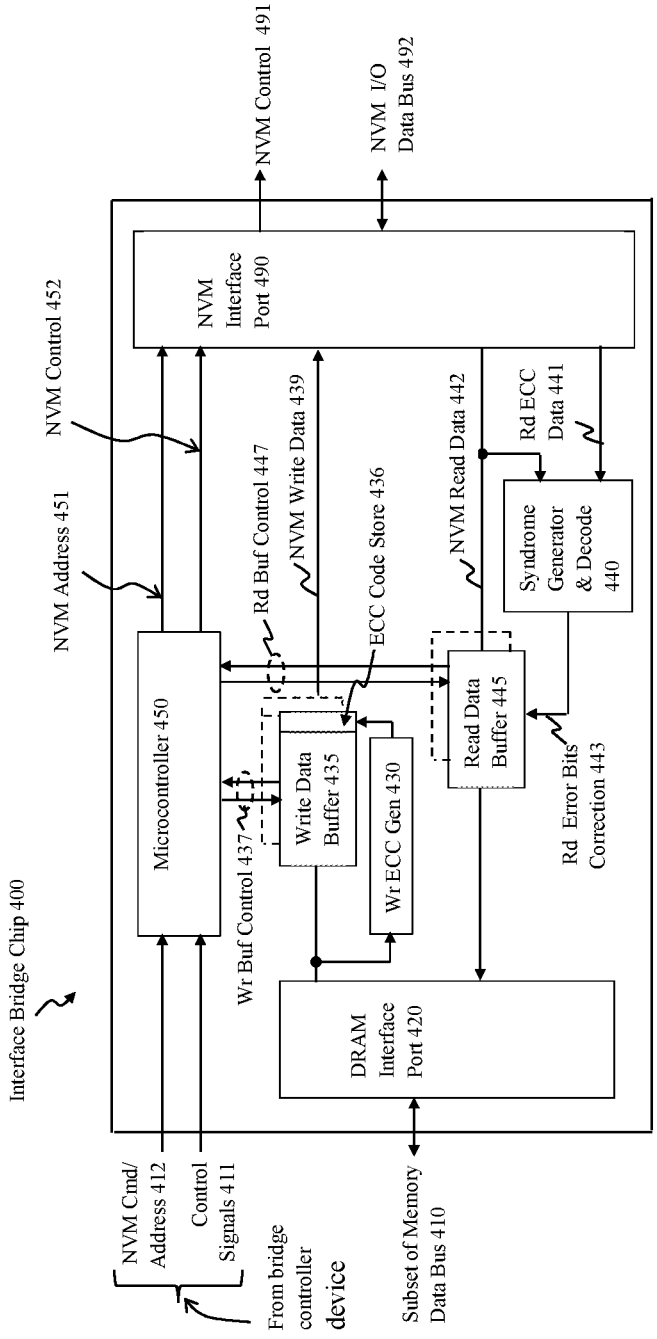
FIG. 4 Example of Functional Block Diagram of Interface Bridge Chip ized chip and NAND Flash chips on module, which may be under-performance. This is because a NAND Flash chip typically only has 8-bit or 16-bit data I/O. It may take four cycles to transfer a 64-bit data to a 16-bit NAND Flash chip, unless the FPGA chips has four embedded processors with four 16-bit interface ports to access four 16-bit NAND Flashes simultaneously.

APPARATUS AND ARCHITECTURE OF NON-VOLATILE MEMORY MODULE IN PARALLEL CONFIGURATION

CROSS REFERENCE TO RELATED APPLICATIONS

The present application is a continuation-in-part of U.S. application Ser. No. 16/114,153, filed on Aug. 27, 2018, which claims benefit under 35 USC 119(e) of U.S. Application No. 62/550,618, filed on Aug. 26, 2017, the contents of both which are incorporated herein by reference in their entirety.

FIELD OF THE INVENTION

The present invention relates to integrated circuits, and more particularly to integrated circuit memories.

BACKGROUND

Various embodiments of the invention relate generally to memory modules and particularly to nonvolatile memory module, where the module may be in dual-in-line form factor (DIMM) or in multi-chip package.

In a legacy computer system, storage device is normally connected to a peripheral bus and DRAM memory is installed on memory bus closely coupled to the memory controller in computer. It takes longer latency to access information on storage device through the peripheral bus. Also, for certain critical applications, it may require to retain contents in main memory when power fails. One attempt to resolve the problem is to add a NAND Flash chip to memory module and to use a FPGA device as Flash controller, plus additional backup battery or super capacitors to provide temporary energy for use during power failure to transfer contents in DRAMs to the on-board NAND Flash chip. This is simply a data backup solution. A memory module including DRAM chips and non-volatile Flash devices on same printed circuit board (PCB) with dual-in-line edge connector is an non-volatile memory module or an NVDIMM. An NVDIMM implementation by JEDEC is the NVDIMM-N module. In NVDIMM-N, the on-board NAND Flash chip is for data backup use during power failure, not as a storage device for host CPU to access as need.

Having memory devices and storage devices on the same memory module so that the module not only functions as a memory device but also as a storage device is highly useful. It would substantially improve computer performance and reduce hardware cost by eliminating a separate peripheral bus for storage device access. A design attempt is to use a single FPGA chip to facilitate data transfer between memory devices and NAND Flash chips. One of drawbacks in this approach is layout design constraint, where all data bits in entire data bus must be routed to the single FPGA chip location for on-board NAND Flash chips access. This causes a severe wire clogging in PCB layout design near FPGA chip area. A thicker PCB with more laminated layers and finer routing traces and pitch may be required for such a design. The highly dense, clogged layout design may also suffer signal interference problem.

Another issue is that a FPGA chip may have limited number of I/Os. To transfer entire data bus on module through the FPGA to NAND Flash chips require a large number of I/O pins on FPGA chip, which is expensive. The third issue is performance. A single FPGA chip typically includes a single processor to handle data transfer between A parallel NVDIMM design uses a multi-processor architecture, where all processors would function in parallel to facilitate data transfer between the entire data bus and on-board storage devices in a single bus transaction, i.e. the use of parallel architecture in NVDIMM design could eliminate the drawbacks encountered in the single FPGA design approach.

SUMMARY

In general, a NVDIMM architecture adopts a plurality of interface bridge chips as multiple processors connected between DRAMs and non-volatile memory (NVM) devices to facilitate parallel data transfer between memory devices and storage devices on module. The architecture makes a simple, straightforward layout design possible as all memory and storage components on module can be dispersed evenly, in parallel, and connected with a shortest trace from the edge connector through DRAMs to on-board NVMs, without suffering trace clogging, signal integrity and/or timing skew issues.

In parallel NVDIMM, a set of edge devices, such as data buffers or tristate-able transceivers, a set of DRAM chips, a set of interface bridge devices, and a set of NVM devices can be placed and lined up in parallel on module. A register chip controls the parallel data transfers between the sets of edge devices and DRAM chips, the set of edge devices and interface bridge chips, and the set of interface bridge chips and DRAM chips. A bridge controller device controls the parallel data transfer between the sets of interface bridge chips and NVM devices. A straight datapath connection from edge connector, to edge device, to DRAM chip, to interface bridge chip and to NVM device can be achieved. For a low-cost solution, where performance is less critical and single memory module on a memory channel is sufficient to meet application requirements, then the edge device is optional and could be omitted in NVDIMM.

The edge device on module could reduce load and increase driving capability on data bits connected to DRAM chips. It could also isolate NVDIMM from memory data bus to avoid bus contention when data are transferred between DRAM chips and interface bridge chips on NVDIMM.

In a parallel NVDIMM, the register chip controls the operations of DRAMs, besides facilitating parallel data transfers among edge devices, DRAM chips and interface bridge chips. The interface bridge chip comprises a DRAM interface port controlled by the register chip to facilitate parallel data transfers with respect to edge devices and DRAM chips, and an NVM interface port controlled by a bridge controller device to synchronize parallel data transfer with respect to on-board storage devices. Both the register chip and the bridge controller device are coupled to a command/address bus input from memory bus. Either single or more command/address buses could be implemented on the memory bus for input through edge connector to the register chip and the bridge controller device. For example, dual command/addresses could be used for NVDIMM with two independent channels on module.

In a parallel NVDIMM, the set of edge devices, the set of DRAM chips, and the set of interface bridge chips can be partitioned into multiple memory subgroups with each memory subgroup being controlled by a respective output port from the register chip. The output port to control the edge devices and the output port to control the interface bridge devices from the register chip could be merged into a single output port, but with respective chip enable for the two different sets of devices.

The set of NVM devices can be also divided into multiple storage subgroups that matches the number of memory subgroups. The data transfer between the storage devices and the interface bridge chip in a storage subgroup is controlled by an output port from the bridge controller device. This is a useful feature. It enables a NVDIMM to support multiple narrower channels of smaller bit width and can idle the un-used channels to save power. The parallel NVDIMM can also be scaled up to support wider data bus from memory controller with more channels to meet applications requirement. The architecture enables the scaling up and down of NVDIMM channels seamlessly.

ECC function may be included in NVDIMM to ensure the integrity of memory data transfer. For example, an 8-bit ECC can be included for the entire 64-bit memory data to form a 72-bit memory bus, such as JEDEC DDR3 and DDR4 memory module. Or, an 8-bit ECC may be incorporated for each 32-bit on data bus, such as JEDEC DDR5, which includes two 8-bit ECCs for 64-bit memory data to form an 80-bit memory bus on module.

The detail descriptions of the particular embodiments are disclosed herein by reference to the specification and the attached drawings.

BRIEF DESCRIPTION OF THE DRAWINGS

FIG. 1 shows a parallel NVDIMM design architecture in 64-bit data bus and 8-bit ECC with 16-bit interface bridge chips.

FIG. 2 shows a parallel NVDIMM design architecture of two 32-bit data bus and dual 8-bit ECCs with 8-bit interface bridge chips. Two output ports in register chip and two interface ports in bridge controller device are shown in the example.

FIG. 3 shows an exemplary functional block diagram of bridge controller device.

FIG. 4 shows an exemplary functional block diagram of interface bridge chip.

DETAILED DESCRIPTION OF THE INVENTION

In accordance with an embodiment, the architecture incorporates a set of interface bridge chips on NVDIMM to facilitate parallel data transfer between the memory devices and a set of non-volatile storage devices in full memory width to achieve highest performance.

In an embodiment, an NVDIMM is configured with a PCB which includes an edge connector to connect to memory bus from memory controller, where the edge connector comprises electric contacts to memory data bus, memory command/address bus, memory control signals, and power and ground. The memory control signals include the memory access control signals comprising chip select and chip enable. The data bits control signals comprise data strobe, and data mask control. The memory module further comprises a plurality of dynamic random-access memory (DRAM) chips, where the DRAM chips are coupled to the memory data bus, through edge device chips. The module also includes a register chip to control access to the plurality of DRAM chips and the DRAM data transfers in NVDIMM.

Additionally, the memory module also comprises a plurality of non-volatile memory chips, a plurality of interface bridge chips, and a bridge controller device. Each of the interface bridge chip has a DRAM interface port coupled to a subset of memory data, and a separate NVM interface port coupled to one or more of the non-volatile memory chips. The bridge controller device controls the operation of interface bridge chips to facilitate parallel data transfer between the memory data and the NVM chips. The interface bridge chips are NVM access devices on NVDIMM.

FIG. 1 shows an exemplary NVDIMM design using a parallel architecture, in accordance with an exemplary embodiment and method, where the NVDIMM 100 includes a PCB 101 with a plurality of gold fingers 105 at its edge connector for plugging into a socket on computer motherboard. The gold fingers 105 provide electrical contact/connection between the NVDIMM 100 and the memory bus of a host computer.

NVDIMM Edge Devices

The memory data bus, coupled to gold finger 105, includes a group of memory data bits coupled to a set of edge devices. In the example shown in FIG. 1, the set of edge devices are data buffers 120, 121, . . . , 128. For non-critical applications where single memory module per memory channel is sufficient to meet system requirement, then a set of resistors may be chosen as the set of edge devices to lower cost. A set of tristate-able, bidirectional transceivers can also be chosen as the set of edge devices for less critical applications, if needing more than one NVDIMM per memory channel.

For higher performance applications, data buffer chips 120, 121, . . . , 128 are used as the set of edge devices. Per JEDEC data buffer specification, data buffer is a dual 4-bit bidirectional register. The device has a dual 4-bit host bus interface that is connected to a memory controller and a dual 4-bit DRAM interface that is connected to two ×4 DRAMs. It also has an input-only control interface that is connected to a register chip. It is reasonable to have every data nibble input from data bus to be controlled by a data strobe to alleviate timing skew issue on long connection trace between memory controller and memory module. However, the dual 4-bit DRAM interface at the output of data buffer should be able to connect to a ×8 DRAM chip to facilitate byte-based data transfer on module. Similarly, two such data buffers should be able to facilitate word-based data transfer between data buffers and a ×16 DRAM chip, due to the close proximity between data buffers and DRAM chips on a module. The data buffer can reduce load on data bus, pipeline data input, and boost driving capability of internal data bus and allow more memory modules to be populated on a memory channel. The data buffer could avoid contention to memory data bus during NVDIMM internal data transfer.

Constituents and Functional Operations of Parallel NVDIMM

The key memory components in NVDIMM comprises a set of DRAM chips. Depending on the configuration of DRAM chips, which may have ×4, ×8, or ×16-bit data I/O, the memory data bus is can be thus partitioned into multiple subgroups comprising 4, 8, or 16-bit of data in each subgroup. A standard DDR4 chip typically has ×4 or ×8 data bit configurations. The standard LPDDR4 die has 16-bit width and can be used in byte mode, including upper bye mode and lower byte mode.

In FIG. 1, the memory data bus comprises 9 data subgroups 110, 111, . . . , 118, with each data subgroup of 8-bit wide coupled to one of data buffer chips 120, 121, . . . , 128. The output of data buffer chip is further coupled to one of DRAMs 130, 131, . . . , 138 and one of NVM interface bridge chips 150, 152, . . . , 158. Besides data, each data bus subgroup also includes Data Strobe, Data Mask and Inversion Control signals for controlling data transfer to respective data buffer or DRAM chip. Control signals in finer granularity may be applied to the 8-bit data subgroup. Although the NVDIMM configuration shown in FIG. 1 uses the ×8 configuration DRAMs, it is applicable to ×4 or even ×16 DRAMs with proper connection on data control signals. Differential data strobe is chosen over the single-ended data strobe for DDR4 and DDR5 in data buffer and DRAM chip.

The gold fingers 105, in NVDIMM 100, also comprises electric contacts coupling to an address/command bus 119 and other control signals for DRAM access, such as Chip Select, Clock and Clock Enable, among others, besides power and ground. The NVDIMM 100 may include a side band bus 180 connected to gold fingers 105 for accessing the on-board supporting integrated circuits (ICs) 181 and 182, such as EEPROM, temperature sensor, and power management ICs. An example of side band bus 180 is the use of an I²C bus to access the Serial Presence Detect (SPD) information stored in the EEPROM. The SPD in NVDIMM 100 contains module configuration information and relevant timing parameters to control the operation of DRAMs on module. The temperature sensor detects temperature information on NVDIMM 100, which may be queried by the host through the side band bus 180 to adjust DRAM operation parameters, such as the refresh rate. It is noted that as being used and referred to herein, "host system" and "host" are synonym and may be used interchangeably. The supporting IC 182 may be one or more voltage regulators or power management ICs added to NVDIMM 100 that regulates supply voltage to different voltage levels for chips or components on NVDIMM 100 to use. The supporting IC 182 may also include a voltage detector function to detect power failure at NVDIMM 100.

The set of DRAM chips on module with total bit width same as the width of memory data bus forms a rank. Each rank of DRAMs is controlled by a chip select. Typically, a register chip controls a rank of DRAM chips. The operation of data buffers could be also controlled by the register chip. The register chip 139 latches and decodes the command/address 119 and other control signals input from memory bus to control the read/write of DRAM chips 130, 131, . . . , 138, and to control the operation of data buffer chips and interface bridge chips.

Depending on the configuration of DRAM chip, the address bits of a DRAM may include higher order bank group bits (BG) and bank address bits (BA), besides the lower order address bits, used to access rows and columns of memory array in DRAM chip. When the NVDIMM 100 is a double-sided memory module, additional register chip may be included at the second side of PCB 101 in NVDIMM 100 to drive the DRAM chips on the second side to form a dual rank memory module. The design example of NVDIMM 100 in FIG. 1, only shows components on one-side of PCB 101.

The NVDIMM 100 also comprises a set of non-volatile memory (NVM) chips 170, 172, . . . , 178. There are different types of non-volatile memories, such as NAND Flash, phase change memory (PCM), resistive random-access memory (ReRAM), and ferroelectric random-access memory (FeRAM). Each type of non-volatile memory has its own advantage(s) and disadvantage(s), such as having limitations on its operating voltage, read/write speed, memory density, reliability, endurance, and/or data retention capabilities. As technology improves to resolve the limitations of non-volatile memories, various types of non-volatile memories with a proper controller could be adopted for parallel NVDIMM design to access NVM chips on NVDIMM. The data transfer between the NVM interface bridge chip, or simply as interface bridge chip, and the NVM device can be a synchronous interface, a toggle mode interface, or an asynchronous interface. An interface bridge chip can be viewed as an NVM access chip.

In FIG. 1, the NVDIMM 100 also comprises a set of interface (I/F) bridge chips 150, 152, . . . , 158, coupled between DRAM chips 130, 131, . . . , 138 and NVM chips 170, 172, . . . , 178. Each interface bridge chip includes a DRAM interface port coupled to a subgroup of memory data. It also includes an NVM interface port coupled to one or more NVM chips on NVDIMM 100. Although FIG. 1 only shows an NVM chip being connected to an interface bridge chip, more NVM chips may be connected at the same NVM interface port, if more Chip Selects are available for NVM access.

Through the set of interface bridge chips 150, 152, . . . , 158, the contents in data buffers 120, 121, . . . , 128 and in DRAMs 130, 131, . . . , 138 can be transferred to NVM chips 170, 172, . . . , 178 respectively. Also, the contents in NVM chips 170, 172, . . . , 178 can be retrieved to DRAM chips 130, 131, . . . , 138 and to data buffers 120, 121, . . . , 128 respectively or simultaneously. All data transfers are in parallel and can be in full bus width.

Besides functioning as a set of parallel processors to access multiple NVM devices simultaneously to boost data transfer performance, the set of interface bridge chips 150, 152, . . . , 158 also functions as rate control buffers between the slower NVM I/O and the high-speed memory data bus. A burst of DRAM data to be written into NVM chips can be transferred and temporarily stored in the internal buffers in interface bridges chips 150, 152, . . . , 158. While waiting for the slower NVM to complete block of data transfer, the set of DRAM chips 130,131, . . . , 138 on module at the meantime can proceed its high-speed data transfer through data buffers 120, 121, . . . , 128 to host interface without interfering the operation of NVMs 170,172, . . . , 178.

The operation of the set of interface bridge chips 150, 152, . . . , 158 of NVDIMM 100 is controlled by the bridge controller device 159 for interfacing to NVM devices and controlled by the register chip 139 for interfacing to internal DRAM bus. The bridge controller device 159 can be a separate chip, or it can be integrated with the register chip 139, depending upon design implementation. The bridge controller device could be two separate chips in an NVDIMM of two separate partitions, with one chip controlling the operation of one partition to reduce the output load.

Seamless Partition and End-to-End ECC in Parallel NVDIMM

Another advantage of parallel architecture is its support for split bus configuration with an end-to-end ECC from data buffers to NVM chips. For example, a 64-bit data bus may be split into two 32-bit partitions to meet application requirements.

FIG. 2 is an exemplary implementation of a NVDIMM 200, where the 64-bit bus is divided into two independent 32-bit partitions. Two output ports are included in the register chip 240 for accessing two sets of DRAM chips 230, 231, . . . , 234 and 235, 236, . . . , 239 respectively. Two additional output ports control two sets of data buffer chips 220, 221, . . . , 224 and 225, 226, . . . , 229 respectively. Further two additional output ports are to control the DRAM interface port in the set of interface bridge chips, i.e. 250, 251, . . . , 254 and 255, 256, . . . , 259 respectively.

Besides a DRAM interface port, there is also an NVM interface port in the interface bridge chip, which is controlled by the bridge controller device 260. In the example of FIG. 2, there are two interface ports in the bridge controller device 260 for accessing two sets of NVM interface bridge chips 250, 252, 254 and 255, 256, 258 respectively. Each interface port in the bridge controller device 260 latches its respective command and address from the command/address bus 219 to control a respective set of interface bridge chips for on-board NVM access. The same command/address protocol for DRAM access is applicable for NVM device access, through respective DRAM command/address transaction to register chip and respective NVM command/address transaction to bridge controller device to transfer data among data buffers, DRAMs, interface bridge chips and NVM devices on NVDIMM.

A register chip with two set of output ports can be implemented as two separate register chips. Similarly, a bridge controller device with two set of interface ports can be implemented as two separate bridge controller devices with each bridge controller device controlling a set of NVM interface bridge chips, such as chips 250, 251, . . . , 254. There are many minor variations in the parallel NVDIMM implementation.

In the example of NVDIMM 200 in FIG. 2, each 32-bit subset of DRAM chips includes an 8-bit ECC support. For example, DRAM chip 234 contains the 8 check bits for DRAMs 230, 231, 232, 233 and similarly DRAM chip 235 contains 8 check bits for DRAMs 236, 237, 238 and 239. In NVDIMM 200, the ECC implementation has clear data path end-to-end, i.e. from data buffer chip 224 next to gold finger 205, to DRAM chip 234, to NVM interface bridge chip 254, and to NVM 274.

To support two separate 32-bit operations, two sets of DRAM command and DRAM addresses would be issued by memory controller to register chip 240 through the command/address bus 219, using two command/address transactions, one for each set. For example, the first set is input and latched for the left port of the register chip 240 to control access to DRAM chips on the left side of NVDIMM 200, and the second set is input and latched for the right port of the register chip 240 to control access to DRAM chips on the right side of NVDIMM 200. Also, two sets of commands can be input to the register chip 240 to configure the operation of data buffers 220, 221, . . . , 224 and 225, 226, . . . , 229. It is equally well to have separate command and address buses at the module interface, if there are two register chips on module, with each command/address bus connected to each register chip. More variations in the configuration of parallel NVDIMM are possible, but is still within the embodiment of parallel architecture.

Similarly, two NVM command and address transactions could be issued by memory controller through the command/address bus 219 to two interface ports in the bridge controller device 260, where one transaction is input and latched by the left port to control operation of interface bridge chips 250, 252, 254 on the left side and the other transaction is input and latched by the right port to control operation of interface bridge chips 255, 256, 258 on the right side of NVDIMM 200.

Four 16-Bit Sub-Channels NVDIMM

More logic partitions in NVDIMM is possible. For example, by partitioning the 64-bit data bus into four 16-bit sub-channels, where each 16-bit sub-channel comprises two ×8 data buffer chips, one 16-bit DRAM chip and one 16-bit interface bridge chip to couple to a 16-bit NVM device. The 64-bit NVDIMM could thus function as four independent 16-bit sub-modules for processing four sets of 16-bit data and accessing four sets of storage devices. For such applications, there could be four set of output ports in the register chips 240 and four set of interface ports in the bridge controller device 260, or using four separate such chips respectively. The ECC function may not be necessary for low cost or non-critical applications.

In a NVDIMM, the number of DRAM chips on module is generally determined by the width of host memory data bus, the DRAM chip configuration, and the requirement of error correction.

Bridge Controller Device

FIG. 3 shows an exemplary functional block diagram of bridge controller device. Using FIG. 1 as an example, the activity on command/address bus 119 of NVDIMM 100 is monitored by the memory interface port 320 at bridge controller device 300. When the memory controller issues an NVM command on the command/address bus 119, the NVM command is latched into the NVM command latch 330 and the NVM address is latched into the extended address latch 335 through the memory interface port 320. Since the bit size of a storage device, i.e. the address range of a nonvolatile memory, is generally very large, more address bits for nonvolatile memory access is required.

The address issued by host memory controller for NVM access is an extended address. For example, if a 128 Gbit or 16,384 M×8 bit NAND Flash is chosen as NVM chip, the memory controller would require a 35-bit extended physical address A34 . . . A0 for NAND access in NVDIMM. Since the command/address bus on memory module is typically a narrower bus to minimize pin count at the edge connector on module, it often requires multiple clock cycles to transfer an extended address to the extended address block 335 in bridge controller device 300 for each NVM command/address transaction in NVM access. Similarly, for DRAM, such as using an 8 Gbit or 1 G×8 bit DRAM as an example, it would require 30 address bits to access memory array in DRAM, where the complete 30-bit DRAM address is normally partitioned into row and column address, plus bank and bank group. Thus, in NVDIMM 100 the complete DRAM address is also multiplexed on the command/address bus 119 to transfer to register chip 139 in multiple clock cycles for DRAM access. Typically, the transaction on the command/address bus may take two clock cycles for DRAM access, but could be more cycles for NVM access.

For managing access to the non-volatile memories in NVDIMM, a set of mode and status registers 340 could be included in the bridge controller device 300 to indicate the configuration and operation modes for NVM access, such as operation conditions, time-out information and transaction status. The mode and status registers 340 can be programmed by the in-band channel, such as through the memory command/address bus 319, or accessed by a bidirectional side band bus 380, such as an $I^2C$ bus, through the side band interface port 385.

For NVM device access, an NVM command from the memory command/address bus 119 will be issued by the host memory controller and is input to the NVM command latch 330, where the latched command is decoded by the NVM command decoder 350. The decoded information will then be transferred to the control block 360 to generate control signals, such as read/write control, for the interface port 390 to proceed. The decoded information, the latched command for NVM devices, and the extended address for NVM access are then output from the interface port 390 to the associated interface bridge chips for accessing the on-board NVMs.

Using FIG. 1 as an example, the handshake and status signals from the set of interface bridge chips 150, 151, . . . , 158 in NVDIMM 100 are monitored by the bridge controller device 159, i.e. by the interface port 390 of bridge controller device 300 in FIG. 3. An open-drain or open collect circuit could be used to monitor the status of all interface bridge chips connected to the interface port 390 to determine if an NVM transaction has been successfully completed or encounters any abnormalities. In case an error or time-out takes place for NVM access, the specific type of abnormality would be detected by the control block 360 and logged into the status register 340. An Alert signal 311 is then asserted through the memory interface port 320 to notify the host.

Interface Bridge Chip

FIG. 4 is an exemplary functional block diagram of an interface bridge chip 400. If NAND Flash chip is chosen as NVM in the example, the interface bridge chip 400, i.e. an NVM access device, would function as a NAND Flash control chip and would have a DRAM interface port 420, rather than a peripheral bus interface port, such as SATA.

FIG. 4 shows a subset of memory data 410 from memory bus is input to the DRAM interface port 420. The burst of write data received at the DRAM interface port 420 is written into the write data buffer 435, or simply as write buffer, and at the same time is also input to the error-correcting code (ECC) generation block 430 to generate error correction code on-the-fly The generated ECC code by the ECC block 430 is written into the write buffer 435 as well in an area 436 reserved for storing ECC codes.

The block of NVM write data and its associated ECC code in write buffer 435 would then be output from the NVM interface port 490 for writing into NVM chips on NVDIMM under control of microcontroller 450. A set of handshake/control signals 437 between the CPU/microcontroller 450 and write buffer 435 enables data to output to NVM interface port 490 and to signal the end of block transfer. Multiple write buffers may be implemented in the interface bridge chip 400. The write buffers may be arranged in ping-pong configuration, if there are only two write buffers. Or, it can be arranged in a round-robin configuration, if there are more than two write buffers. The write buffers function as rate control device between the high throughput DRAM interface 420 and the slow throughput NVM interface 490. Depending upon design implementation, the same ECC generator may be shared by multiple write buffers, if more than one.

The microcontroller 450, which receives control signals 411 and NVM command/address 412 from the bridge controller device 300, would generate proper controls and wear-levelled address for output through the NVM interface port 490 to access NVM chips on NVDIMM. Because of low write endurance of NAND Flash cells, i.e. Flash cells only endue a limited number of programming cycles, a wear leveling technique is thus required to translate the incoming extended address, or logic address, into an NVM address 451, or physical address, for writing to the good known blocks in NAND Flash chip.

In addition, because of large number of address bits for NAND Flash access and because of package pinout compatibility concern for higher capacity NANDs, the NAND Flash interface is also a multiplexed interface, i.e. the NVM address, the write or read data are multiplexed onto a narrow I/O interface for NAND access. The implementation of NVM interface port 490 depends upon the NVM device being chosen. The NVM interface port 490 can be either a synchronous interface, such as ONFi or toggle mode, or an asynchronous interface, such as the one in conventional NAND Flash chip.

For NAND Flash access, the high order bits of NVM address 451 may be used as chip selects output from the NVM interface port 490 for multiple NAND Flash chips access, while the lower order address bits and the NAND Flash data are multiplexed on the NVM I/O data bus 492 to access NVM chip. Other control signals 491 for NVM access are also output from the NVM interface port 490, such as the Write Enable #, Output Enable #, Address Latch Enable (ALE), Command Latch Enable (CLE), and Ready/Busy #handshake signals, etc. for NAND access.

The NVM read data 442 from NVM chip are input to the read data buffer 445 and at the meantime also input to the syndrome generator and decode block 440, where the ECC code generated by syndrome generator block 440 will be compared with the ECC data 441 read from the NVM chip to check for the errors of read data and to decode the error bit locations, if any. The corrected data bits will be written into the read data buffer 445 to replace the erroneous bits in read buffer 445. Multiple read buffers may be included in the interface bridge chip 400, which may share the same syndrome generator and decoder block 440, depending upon the chip design implementation.

At the internal DRAM bus in NVDIMM, it is possible to have two or more DRAM chips of smaller number of data bits connected to a DRAM interface port of larger data width in interface bridge chip. For example, in FIG. 1, two ×8 DRAM chips 130, 131 are connected to an interface bridge chip 150 comprising a 16-bit DRAM interface port. More than one DRAMs can be connected to the DRAM interface port as long as the total number of data bits matches the number of I/O pins at the DRAM interface port of the interface bridge chip.

A feasible implementation of parallel NVDIMM is the use of a 16-bit interface bridge chip to connect to four ×4 DRAM chips, or to connect to two ×8 DRAM chips, or even to a single ×16 DRAM chip at its DRAM interface port. The 16-bit interface bridge chip can be connected to a 16-bit NAND Flash chip at its NVM interface port to optimize transfer.

It is possible to have an interface bridge chips to access a set of NVM devices having a small number of I/O pins. For example, assume that an interface bridge chip has a 16-bit NVM interface port to access two NVMs of 8-bit I/O each, then if a 16-bit DRAM data is input to the bridge interface chip, it can be divided into two sets of 8-bit data with each 8-bit to be stored in an 8-bit NVM chip. The extended address input to the interface bridge chip from the bridge controller device could then be re-mapped by the microcontroller in the interface bridge chip into two sets of wear-levelled addresses coupled with two sets of defect tables, one for each NVM chip to keep track of the defective blocks in NVM. The wear-levelled address would also be partitioned into multiple 8-bit sections to be multiplexed with 8-bit data for accessing respective NVM chip. With such implementation, the two 8-bit NVM chips could be accessed simultaneously by a 16-bit interface bridge chip. It is simply an example to describe the transaction at the interface between interface bridge chip and NVM device and may not be an optimal implementation.

Typically, the number of I/O bits at NVM interface port 490 is chosen to match the number of I/O bits at NVM chip.

For example, if an 8-bit NAND Flash is chosen as NVM device, then the bridge interface chip is preferred to have an 8-bit NVM interface port, where NVM command, address and data will be multiplexed over the 8-bit I/Os at NVM interface port 390. However, if a 16-bit NAND Flash chip is chosen for NVDIMM, then for a 64-bit memory bus, then 4 interface bridge chips of ×16 I/O port will be included in the NVDIMM 100 to connect to 4×16 NAND Flash chips. In case, there is ECC support, then an additional ×8 interface bridge chip can be included to connect to a ×8 NAND Flash, so that all 64/72-bit data could be transferred in parallel simultaneously between NAND Flash chips and interface bridge chips to achieve the highest data store performance.

When accessing NAND Flash chips in parallel, all interface bridge chips would latch the same command and extended address to access their respective NAND Flashes. A handshake signal, such as an active low ready signal RDY #, can be wire-ORed to all interface bridge chips on the same rank or the same group and input to the bridge controller device 159 to indicate whether the entire 64/72-bit data has been successfully transferred to or from the NAND chips.

More Design Variations and Data Transfers in Parallel NVDIMM

Bidirectional, tristate transceivers may be used to replace data buffers in NVDIMM to avoid bus contention, which can also reduce the load of memory data bus at the expenses of additional transceiver delay. The advantage of tristate transceiver is its lower cost and smaller footprint than that of a data buffer chip. The operation of the bidirectional tristate-able transceivers and will be also controlled by the register chip. Serial resistor may be added to each data bit input path to match trace impedance.

Parallel Data Transfer in NVDIMM

Data input from memory bus for transferring to the DRAM chips and to the interface bridge chips can be done in single bus transaction or in two separate bus transactions. If it is in two bus transactions, then the chip select to access the set of DRAM chips 130, 131, ..., 138 and the chip select to access the DRAM interface port in the set of interface bridge chips 150, 152, ..., 158 would be asserted separately by the host memory controller with two separate command/address transactions.

For example, for data write, the host memory controller at first could activate a DRAM bus transaction by issuing a DRAM write command/address to the register chip 139, followed by a data transaction to write a sequence of burst data to DRAM chips 130, 131, ..., 138 at DRAM address specified by the command/address transaction, where Chip Select for DRAM access will be asserted by the register chip 139. Then, for writing into the interface bridge chip, the host memory controller would also need to issue an interface bridge chip write command to the bridge controller chip to assert a Chip Select for the set of interface bridge chips, followed by a data transaction to write a sequence of burst data into the write buffer in the set of interface bridge chips 150, 152, ..., 158. The burst data written into DRAM chips and the burst data written into interface bridge chips can be different in this case.

However, the double data transfers to both DRAM chips and interface bridge chips can be done in a single bus transaction, which is a useful feature to write same set of burst data simultaneously into both sets of chips. A special command/address bus transaction will be issued by the memory controller for the register chip 139 to generate both Chip Selects for the DRAM chips and the interface bridge chips to enable simultaneous data write to both. The simultaneous write feature could eliminate additional bus transaction to write same set of data into DRAM chips and interface bridge chips, thus improving system performance.

As for transferring data between the set of interface bridge chips and the set of NVM devices on NVDIMM, the memory controller would require to issue an NVM command/address bus transaction to the bridge controller device for it to latch in the NVM command and the extended address with proper control signals for NVM access.

For data read from the set of NVM chips 170, 172, ..., 178, at first an NVM command/address is issued by the memory controller which is latched by the bridge controller device 159, and then a data read NVM transaction is also issued by memory controller to activate the bridge controller device 159 to latch data output from the set of NVMs 170, 172, ..., 178 into read buffers in the set of interface bridge chips 150, 152, ..., 158. The data transfer between the interface bridge chip and the NVM device is large in size and may be up to a block of data.

Similarly, data output from the set of DRAM chips can also be written into the set of interface bridge chips and/or to data buffers for further output to memory bus, either respectively or simultaneously. This is because the operation of DRAM chips, the data buffer chips and the interface bridge chips are all controlled by the same register chip on NVDIMM.

Better Performance than Single FPGA Implementation in a Parallel NVDIMM

The implementation of NVDIMM using a single FPGA or a single ASIC chip for NVM access has inferior data throughput than that of a parallel NVDIMM. This is because the data transfer between FPGA chip and NVM device is crippled by the narrowed I/O of the NVM device. In a NVDIMM using the parallel design architecture, a full width of memory data can be transferred all at once in parallel, without partitioning the entire data bus into multiple sections for transferring in a queue through the narrower I/O port on FPGA or ASIC. Since the access to NVMs are typically block based, the performance degradation in large data transfer between NVM device and single FPGA chip is substantial.

In case the NVDIMM using a single FPGA chip has the same number of I/O pins as the width of memory bus for NVM access and is capable of driving a full width of memory data into multiple NVM chips in parallel to resolve I/O limitation, for example, say having 64-bit data I/O pins in FPGA to access a set of four NAND Flash chips of 16-bit, the bottleneck is then shifted to the internal processor in FPGA chip as it would still need to generate four sets of wear leveled address by its internal CPU/microcontroller and to maintain four sets of defect table for access to four Flash chips. The defect tracking activity for accessing multiple NAND Flashes by a single processor in FPGA or ASIC would still degrade the performance of such an NVDIMM severely.

In the parallel NVDIMM 100, the set of interface bridge chips 150, 151, ..., 158 functions coherently as a set of multiprocessors in NVDIMM to manage respective defect table and to use respective I/O interface for respective NVM access to facilitate parallel data transfer between the set of non-volatile memory chips 170, 171, ..., 178 and the rest of memory devices on module. The synchronization in multiprocessing and the parallel data transfer within a parallel NVDIMM are achieved by the bridge controller device 159 and the register chip 139 on module.

It is also noted that the NVM chip in parallel NVDIMM is in a fix connection to a respective interface bridge chip, which is different from the FPGA implementation where stored data can be routed to various NVMs similar to a switching interconnect.

Some application may require retaining the DRAM contents when there is a power failure. This becomes a bigger and bigger challenge as memory capacity becomes larger and larger. The NVDIMM in parallel architecture is a feasible solution to achieve a high transfer throughput for backing up DRAM contents into comparatively slow NVM devices on power abnormality.

In additions, when there is a data miss in host processor, it would need to retrieve data from storage device in the shortest time, the parallel architecture enables the highest throughput to retrieve data from NVM through the set of parallel interface bridge chips for output to the memory bus and at the meantime the read data from NVMs could be latched into the on-board DRAM to reduce the miss wait time for host processor and to retrieve/fill miss data into memory.

Compared with the NVDIMM implementation by using a single FPGA chip, it is by no mean straightforward to partition the NVDIMM into multiple independent narrower channels, especially if the FPGA chip only has one CPU/microcontroller to facilitate defect block management on multiple NVMs access.

Although various embodiments have been described with reference to a 64-bit memory bus, it is understood that this is merely an example of parallel NVDIMM implementation, and that a memory bus may have a different bus width than 64 bits. For example, a high bandwidth memory (HMB) device, internally uses multiple DRAM die-stacking into multiple channels and has an interface of 128 data bits. Similar or other technology can be applied to the parallel NVDIMM assembly.

For example, the NVM module can be assembled as a multi-chip module in multi-chip package using ball grid array as edge connector, where multiple integrated circuits or multiple dies and/or other discrete devices can be placed or stacked on the module.

The parallel NVM module can be assembled in a 3D configuration, where a substrate is used to replace PCB, ball grid array is used to replace gold fingers as edge connector for connecting to memory controller. The dies of integrated circuit components in the 3D configuration can be dispersed on a set of interposers, where an interposer is mounted or placed a set of devices, such as a set of DRAM dies/chips, a set of interface bridge dies/chips and a set of NVM dies/chips respectively to form a multiple layer structure. The substrate may have data buffers, passive components, supporting ICs and register chip on it. Each interposer has same set of control signals to control the operation of same set of devices. Due to a straight connection among different devices in a parallel non-volatile memory module, the through-silicon-via (TSV) can be used as vertical interconnect to link data buffer devices, DRAM devices, interface bridge devices, and NVM devices on interposers at different layers. The command/address bus from ball grid array can be linked to the register die/chip and to the bridge controller die/device through interposer. The 3D package is an alternative solution for a non-volatile memory module assembly.

One advantage of NVDIMM in parallel design architecture is to have data-path routed vertically and to have control-path routed horizontally. In addition, every data lane or every data sub-bus partition on a parallel NVDIMM can be routed within a narrow stripe on PCB without interfering each other. This facilitates a straight-forward layout design and achieves better signal integrity among signals.

Another alternative for a parallel NVDIMM assembly is to have DRAM chips on one side of PCB and the NVM chips on the other side, so that data-path for DRAM access would run vertically on one side of PCB and data-path for the NVM access would run vertically on the other side. The length of data-path is short in a parallel NDIMM. Data-path does not cross-over each other for its layout design on PCB.

The control path on parallel NVDIMM is longer. But the control path, including DRAM controls and DRAM address bus being output from the register chip for DRAM access, and the control path, including NVM control signals and NVM address bus being output from the bridge controller device for interface bridge chip access can be confined in a narrow horizontal strip of PCB and can be routed underneath the components they are connected to. The interference among control signals can be minimized with proper power/ground layer shielding. Thus, it is possible to have two or more ranks of DRAM on one side of PCB and two or more rows of NVM devices on the other side of PCB to increase the memory size and the storage capacity, if needed. One or more register chips and one or more bridge controller devices, which share the same command/address bus input from edge connector can be placed and aligned back-to-back at the front and the back side of PCB respectively to achieve a neat layout routing for the command/address bus.

In some low-cost solution, if resistors are chosen as edge devices on NVDIMM, the control signals from register chip to configure the operation of edge devices are no longer necessary. The output port from register chip to control edge devices can be eliminated in this case.

The non-volatile memory module is a new class of solid-state device. It is different from a solid-state drive, which is accessed by a peripheral bus. The new class of device includes memory function and data storage function in a single module. It enables host system to use memory bus to access storage devices and to use the same memory command protocol for on-board storage device access. The parallel architecture enables contents in memory devices and in storage devices to be exchanged freely on the non-volatile memory module under the control of memory controller to boost host performance and to retain data even if power to the host is shut off.

The configuration of non-volatile memory module can be partitioned or expanded into multiple independent channels on module. It is scalable to a wider data bus on module and still operate seamlessly without encountering performance bottleneck. It can be implemented with or without ECC supports.

Although the description has been described with respect to particular embodiments thereof, it is understood that these particular embodiments are merely illustrative, and not restrictive.

What is claimed is:

1. A memory module configured to connect to a memory bus from a host system, the memory module comprising:
    a circuit board including an edge connector with connection contacts to a memory data bus, a memory command/address bus, memory control signals, and power and ground;
    a plurality of edge devices coupled to the memory data bus;
        a plurality of DRAM chips;
        a plurality of interface bridge chips;
        a register chip configured to facilitate parallel data transfer among the memory data bus, the plurality of edge devices, the plurality of DRAM chips and the plurality interface bridge chips;

a plurality of non-volatile memory (NVM) chips;
a plurality of interface bridge chips, wherein each interface bridge chip comprising a DRAM interface port and a non-volatile memory interface port; and
a bridge controller device configured to facilitate parallel data transfer between the plurality of interface bridge chips and the plurality of NVM chips.

2. The memory module of claim 1, wherein the plurality of edge devices are data buffer chips with input to interface with the memory data bus and output to interface with at least one of the plurality of DRAM chips and at least one of the plurality of interface bridge chips.

3. The memory module of claim 1, wherein the plurality of edge devices are tristate transceivers with input to interface with the memory data bus, and output to interface with at least one of the plurality of DRAM chips and at least one of the plurality of interface bridge chips.

4. The memory module of claim 1, wherein the plurality of edge devices reduce load of memory data bus input to the memory module.

5. The memory module of claim 1, wherein the plurality of edge devices are capable of isolating the memory module from the memory bus to avoid bus contention on internal data transfer to the plurality of DRAM chips.

6. The memory module of claim 1, wherein the plurality of edge devices are resistors in serial connection to the memory data bus at input next to the edge connector, wherein one resistor is connected to one data bit.

7. The memory module of claim 1, wherein the circuit board is a silicon substrate.

8. The memory module of claim 1, wherein the circuit board is a printed circuit board.

9. The memory module of claim 1, wherein the edge connector comprises a plurality of gold fingers at the edge of circuit board for plugging into a socket being coupled to the memory bus.

10. The memory module of claim 1, wherein the edge connector being a fine pitch connector to connect to a matching connector coupled at the memory bus.

11. The memory module of claim 1, wherein the register chip comprises a register command/address port to interface with the command/address bus input from edge connector for receiving command and DRAM address information so as:
to generate DRAM controls and DRAM address, output from a DRAM interface port to control access to the plurality of DRAM chips;
to generate edge device control signals, output from an edge device control port to control operation of the plurality of edge devices; and
to generate interface bridge control signals, output from an interface bridge control port to control operation of the plurality of interface bridge chips.

12. The memory module of claim 1, wherein data are transferred in parallel from the plurality of edge devices to the plurality of DRAM chips, and to the plurality of interface bridge chips under control of the register chip.

13. The memory module of claim 1, wherein data are transferred in parallel from the plurality of DRAM chips to the plurality of edge devices, and to the plurality of interface bridge chips under control of the register chip.

14. The memory module of claim 1, wherein data are transferred in parallel from the plurality of interface bridge chips to the plurality of edge devices, and to the plurality of DRAM chips under control of the register chip.

15. The memory module of claim 1, wherein each interface bridge chip comprises:
a write buffer to receive data input from the DRAM interface port for output to the NVM interface port, and
a read buffer to receive data input from the NVM interface port and for output to the DRAM interface port.

16. The memory module of claim 1, wherein the bridge controller device comprises a controller command/address port to interface with the command/address bus input from edge connector to receive NVM command and storage address information to generate control signals and to transfer storage address for output from an interface port to the plurality of interface bridge chips to control access to the plurality of NVM chips.

17. The memory module of claim 1, wherein the plurality of interface bridge chips being a plurality of processors functioning in parallel to control access to the plurality of non-volatile memory chips.

18. The memory module of claim 1, wherein a selected one of the plurality of edge devices, a selected one of the plurality of DRAM chips, a selected one of the plurality of interface bridge chips and a selected one of the plurality of nonvolatile memory chips are in fixed connection at close proximity on the circuit board to alleviate layout design constraints with minimal signal interference.

19. The memory module of claim 1, wherein full width of data on the memory data bus is transferrable to the plurality of non-volatile memory chips in parallel through the plurality of interface bridge chips under control of the bridge controller device.

20. The memory module of claim 1, wherein each of the plurality of edge devices, the plurality of DRAM chips, the plurality of interface bridge chips, the plurality of NVM chips and the memory data bus are partitionable into multiple subgroups, wherein each subgroup comprises an equal bit width, and one subgroup from each of the memory data bus, the plurality of edge devices, the plurality DRAM chips, the plurality of interface bridge chips, and the plurality of NVM chip is selected and linked in sequence to form a lane from subgroup of memory data bus to subgroup of the plurality of NVM chips in the memory module.

21. The memory module of claim 20 wherein equal bit width is 8-bit wide, wherein four lanes transferring memory data and one lane processing ECC data for the four lanes transferring memory data form a 40-bit channel with operation of the 40-bit channel under control of a DRAM output port from the register chip and an interface port from the bridge controller device.

22. The memory module of claim 1, wherein the memory data bus is 72-bit wide, comprising 64-bit data and 8-bit ECC, wherein ECC function protects integrity of 64-bit data on the memory module from the edge connector to plurality of NVM chips.

23. The memory module of claim 1, wherein the memory module is 80-bit wide, comprising two channels with each channel comprising 32-bit data and 8-bit ECC, wherein each of two channels can function independently, and the two channels can also function coherently as single unified module.

24. The memory module of claim 1, further comprising a side band bus to program control word and to access control status in the register chip, the bridge controller device, and on-board supporting components.

* * * * *